United States Patent
Chang et al.

(10) Patent No.: US 10,636,787 B2
(45) Date of Patent: Apr. 28, 2020

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Che-Cheng Chang, New Taipei (TW); Po-Chi Wu, Zhubei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 60 days.

(21) Appl. No.: 15/978,589

(22) Filed: May 14, 2018

(65) Prior Publication Data
US 2018/0269207 A1   Sep. 20, 2018

Related U.S. Application Data

(62) Division of application No. 14/968,468, filed on Dec. 14, 2015, now Pat. No. 9,991,256.

(51) Int. Cl.
| | |
|---|---|
| *H01L 27/088* | (2006.01) |
| *H01L 29/06* | (2006.01) |
| *H01L 29/66* | (2006.01) |
| *H01L 21/8234* | (2006.01) |
| *H01L 21/84* | (2006.01) |
| *H01L 27/12* | (2006.01) |

(52) U.S. Cl.
CPC .. *H01L 27/0886* (2013.01); *H01L 21/823431* (2013.01); *H01L 21/823481* (2013.01); *H01L 29/0649* (2013.01); *H01L 29/0692* (2013.01); *H01L 29/6681* (2013.01); *H01L 29/66545* (2013.01); *H01L 21/845* (2013.01); *H01L 27/1211* (2013.01)

(58) Field of Classification Search
CPC ......... H01L 21/0886; H01L 21/823481; H01L 21/823431; H01L 21/845; H01L 27/1211; H01L 29/0649; H01L 29/0692; H01L 29/66545; H01L 29/6681
See application file for complete search history.

(56) References Cited

U.S. PATENT DOCUMENTS

| | | |
|---|---|---|
| 9,722,050 B2 | 8/2017 | Li et al. |
| 2013/0309838 A1 | 11/2013 | Wei et al. |
| 2013/0330889 A1 | 12/2013 | Yin et al. |
| 2016/0005866 A1 | 1/2016 | Wu et al. |
| 2017/0084494 A1 | 3/2017 | Chiang et al. |

FOREIGN PATENT DOCUMENTS

| | | |
|---|---|---|
| CN | 103474397 A | 12/2013 |
| CN | 104465717 A | 3/2015 |
| CN | 106505096 A | 3/2017 |

*Primary Examiner* — Timor Karimy
(74) *Attorney, Agent, or Firm* — Slater Matsil, LLP

(57) ABSTRACT

A method for manufacturing a semiconductor structure includes forming a plurality of dummy semiconductor fins on a substrate. The dummy semiconductor fins are adjacent to each other and are grouped into a plurality of fin groups. The dummy semiconductor fins of the fin groups are recessed one group at a time.

20 Claims, 15 Drawing Sheets

SEMICONDUCTOR STRUCTURE AND MANUFACTURING METHOD THEREOF

PRIORITY CLAIM AND CROSS-REFERENCE

This application is a divisional of application Ser. No. 14/968,468, filed Dec. 14, 2015, entitled "Semiconductor Structure and Manufacturing Method Thereof," which application is hereby incorporated herein by reference.

BACKGROUND

Semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has increased while geometry size (i.e., the smallest component (or line) that can be created using a fabrication process) has decreased. This scaling down process provides increasing production efficiency and lowering associated costs.

Such scaling down has also increased the complexity of processing and manufacturing ICs and similar developments in IC processing and manufacturing are provided. For example, a three dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalls.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
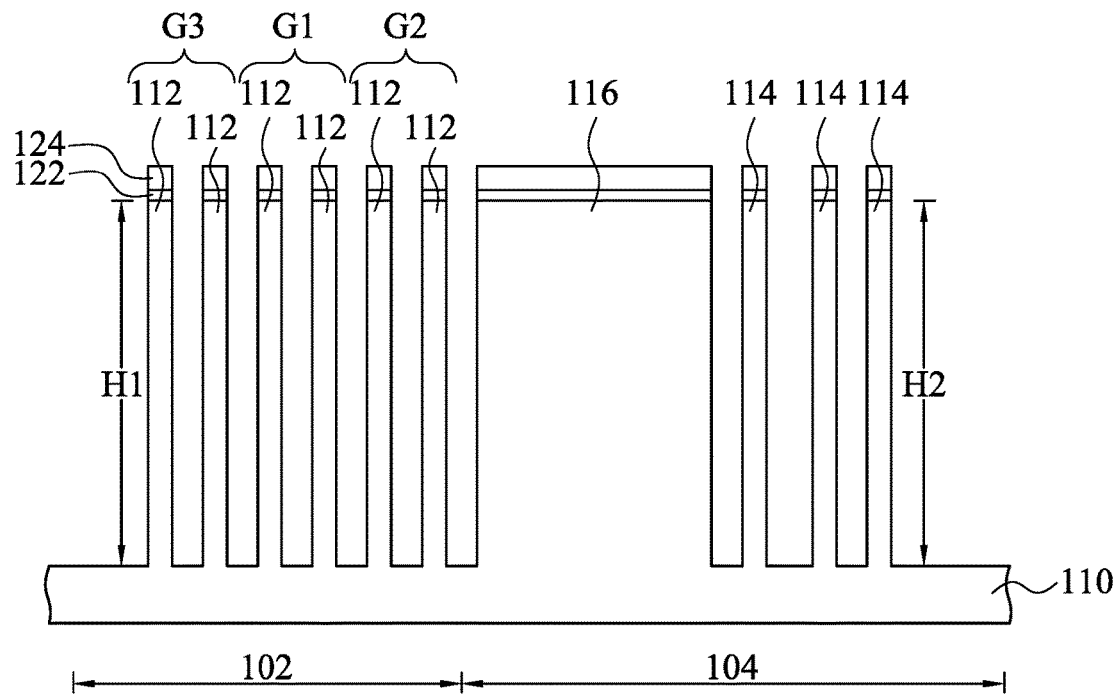
FIGS. 1A to 1H are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a FinFET device. The following disclosure will continue with a FinFET example to illustrate various embodiments of the present application. It is understood, however, that the application should not be limited to a particular type of device.

FIGS. 1A to 1H are cross-sectional views of a method for manufacturing a semiconductor device at various stages in accordance with some embodiments of the present disclosure. Reference is made to FIG. 1A. A substrate 110 is provided. The substrate 110 has at least one isolation region 102 and at least one active region 104. For example, in FIG. 1A, the substrate 110 has one isolation region 102 and one active region 104. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

A plurality of dummy semiconductor fins 112 are formed on the isolation region 102 of the substrate 110. The dummy semiconductor fins 112 are adjacent to each other and are grouped into a plurality of fin groups. In greater detail, there are three fin groups G1, G2, and G3 in FIG. 1A. However, in some other embodiments, the number of the fin groups is not limited in this respect. The fin groups G1, G2, and G3 are adjacent to each other. For example, in FIG. 1A, the fin group G1 is disposed between the fin groups G2 and G3. The fin groups G1, G2, and G3 respectively include at least two adjacent dummy semiconductor fins 112. For example, in FIG. 1A, the fin groups G1, G2, and G3 respectively include two adjacent dummy semiconductor fins 112. It is noted that the number of the dummy semiconductor fins 112 in FIG. 1A are illustrative, and should not limit the claimed scope of the present disclosure. A person having ordinary skill in the art may select suitable numbers for the dummy semiconductor fins 112 according to actual situations.

In some embodiments, the dummy semiconductor fins 112 include silicon. The dummy semiconductor fins 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the dummy semiconductor fins 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some embodiments, at least one active semiconductor fin 114 is formed on the active region 104 of the substrate 110. For example, in FIG. 1A, there are three active semiconductor fins 114. The active semiconductor fins 114 have functionality in the semiconductor device while the dummy semiconductor fins 112 have no functionality in the semiconductor device but make the device processes more uniform, more reproducible, and more manufacturable.

The active semiconductor fins 114 can be formed with the dummy semiconductor fins 112. In some embodiments, the height H1 of the dummy semiconductor fins 112 and the height H2 of the active semiconductor fins 114 can be about 100 nm to about 160 nm, and the claimed scope is not limited in this respect.

In some embodiments, an oxide define (OD) pattern 116 can be formed on the active region 104 of the substrate 110. In FIG. 1A, the OD pattern 116 is disposed between the active semiconductor fins 114 and the dummy semiconductor fins 112 for defining active areas, and the claimed scope of the present disclosure is not limited in this respect. The OD pattern 116 can be formed with the dummy semiconductor fins 112 and the active semiconductor fins 114. In FIG. 1A, the active semiconductor fins 114 and the OD pattern 116 are active structures.

For forming the dummy semiconductor fins 112, the active semiconductor fins 114, and the OD pattern 116, a pad layer 122 and a mask layer 124 can be formed on the substrate 110 in advanced. The pad layer 122 includes a dielectric material, such as silicon oxide, silicon nitride, silicon oxynitride, or any other suitable dielectric material. The mask layer 124 includes a dielectric material, such as silicon oxide, silicon nitride, silicon oxynitride, or any other suitable dielectric material. In some embodiments, the mask layer 124 is a hard mask layer. In some embodiments, the pad layer 122 is a silicon oxide layer deposited on the substrate 110, and the mask layer 124 is a silicon nitride layer deposited on the pad layer 122. The pad layer 122 and the mask layer 124 can be formed by thermal oxidation, chemical oxidation, atomic layer deposition (ALD), or any other appropriate method. In some embodiments, the thickness of the pad layer 122 may be between about 100-800 Angstroms, and the thickness of the mask layer 124 may be between about 200-2000 Angstroms. Subsequently, a lithography process defining the dummy semiconductor fins 112, the active semiconductor fins 114, and the OD pattern 116 on the semiconductor substrate 110 is performed.

Figure 1B:
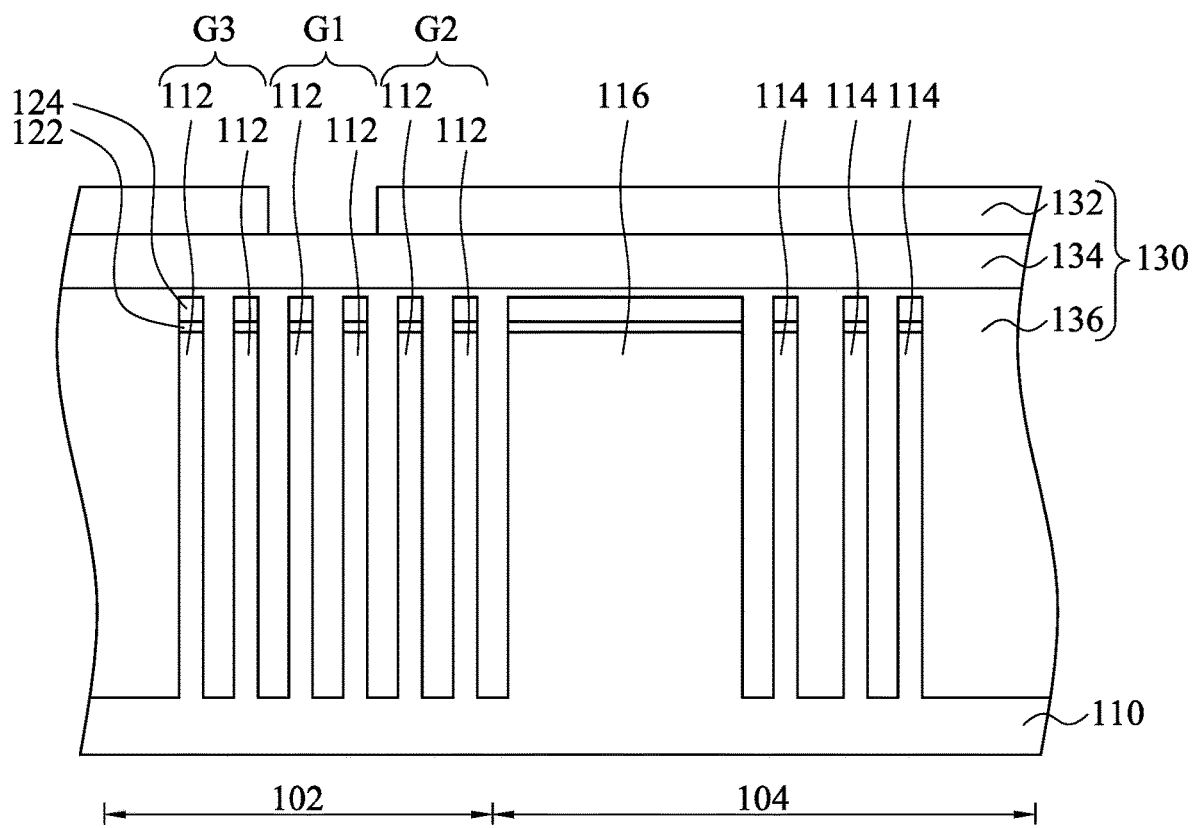

Reference is made to FIG. 1B. A tri-layer photoresist 130 may be used, including a photoresist (PR) layer 132 as the top or uppermost portion, a middle layer 134, and a bottom layer 136. The tri-layer photoresist 130 covers the dummy semiconductor fins 112, the active semiconductor fins 114, and the OD pattern 116. The tri-layer photoresist 130 provides the PR layer 132, the middle layer 134 which may include anti-reflective layers or backside anti-reflective layers to aid in the exposure and focus of the PR processing, and the bottom layer 136 which may be a hard mask material; for example, a nitride.

The PR layer 132 of the tri-layer photoresist 130 is then patterned. The patterned PR layer 132 exposes portions of the middle layer 134 disposed on the dummy semiconductor fins 112 of the fin group G1. Meanwhile, another portions of the middle layer 134 disposed on the dummy semiconductor fins 112 of the fin groups G2 and G3, the active semiconductor fins 114, and the OD pattern 116 are still covered by the PR layer 132. To pattern the tri-layer photoresist 130, the PR layer 132 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 132. This patterned PR layer 132 is then used to etch the underlying middle layer 134 and bottom layer 136 to form an etch mask for the target features; here, the dummy semiconductor fins 112 of the fin group G1.

Figure 1C:
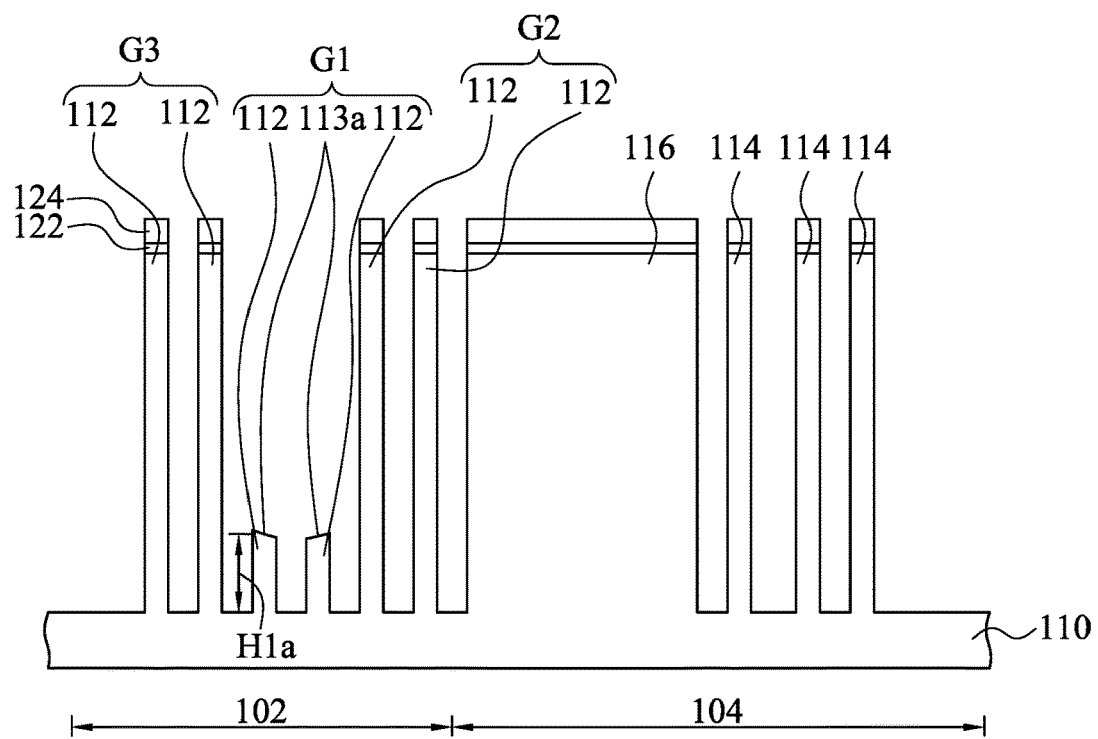

Reference is made to FIG. 1C. Using the patterned PR layer 132 (see FIG. 1B) as a mask, the middle layer 134 and the bottom layer 136 of the tri-layer photoresist 130 (see FIG. 1B) are etched by various methods, including a dry etch, a wet etch, or a combination of dry etch and wet etch. Then, portions of the mask layer 124 and the pad layer 122 (see FIG. 1B) disposed on the dummy semiconductor fins 112 of the fin group G1 are removed (or etched). Next, at least portions of the dummy semiconductor fins 112 of the fin group G1 are recessed (or etched or removed). The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple-step etching to gain etch selectivity, flexibility and desired etch profile. After the dummy semiconductor fins 112 of the fin group G1 are partially recessed, the PR layer 132, the middle layer 134 and the bottom layer 136 of the tri-layer photoresist 130 are removed, for example, by ashing. The ashing operation such as a plasma ash removes the remaining tri-layer photoresist 130, and a wet clean may be performed to clean the etch residues.

In FIG. 1C, the heights H1a of the recessed dummy semiconductor fins 112 of the fin group G1 can be about 15 nm to about 30 nm. At least one of the dummy semiconductor fins 112 of the fin group G1 has a top surface 113a. The top surface 113a can be concave. In some embodiments, the top surfaces 113a of the dummy semiconductor fins 112 of the fin group G1 are curved inwardly. Moreover, in some embodiments, the heights H1a of the two recessed dummy semiconductor fins 112 of the fin group G1 are substantially the same. The term "substantially" as used herein may be applied to modify any quantitative representation which could permissibly vary without resulting in a change in the basic function to which it is related.

Figure 1D:
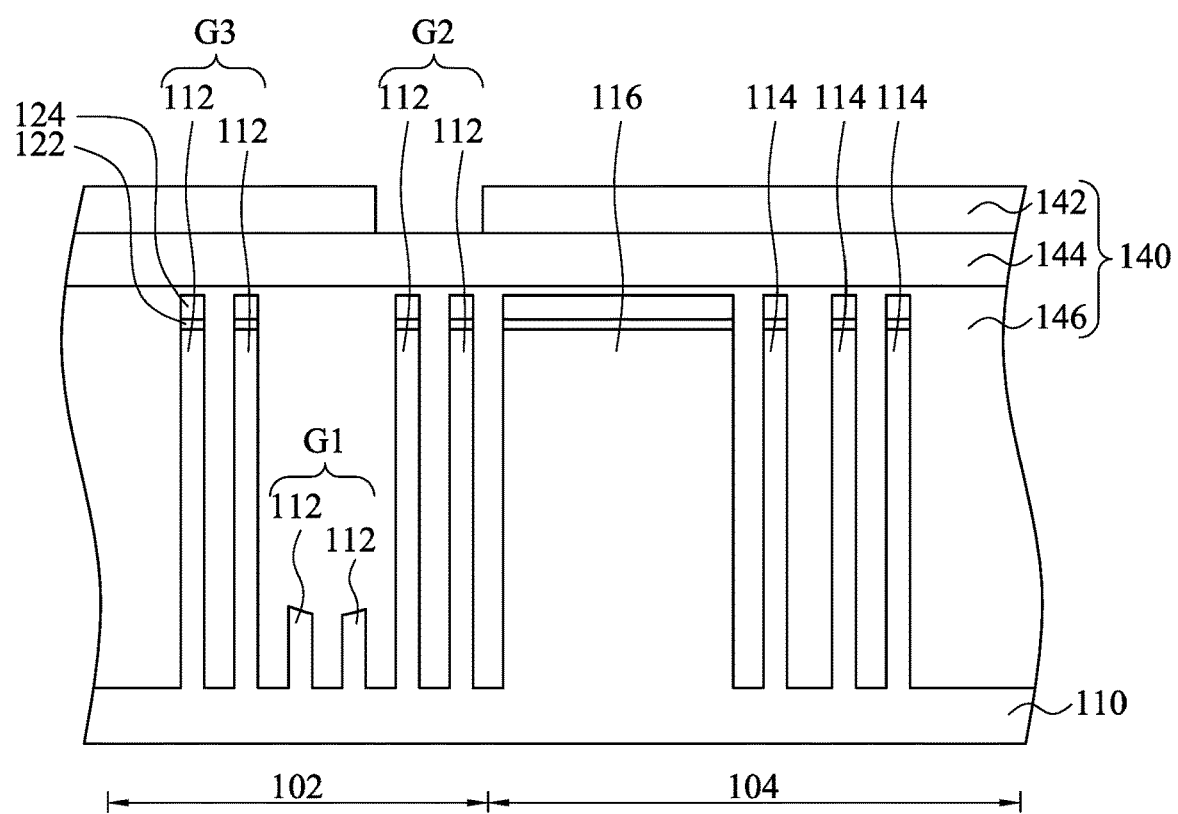

Reference is made to FIG. 1D. Another tri-layer photoresist 140 may be used, including a photoresist (PR) layer 142 as the top or uppermost portion, a middle layer 144, and a bottom layer 146. The tri-layer photoresist 140 covers the dummy semiconductor fins 112, the active semiconductor fins 114, and the OD pattern 116. The tri-layer photoresist 140 provides the PR layer 142, the middle layer 144 which may include anti-reflective layers or backside anti-reflective layers to aid in the exposure and focus of the PR processing, and the bottom layer 146 which may be a hard mask material; for example, a nitride.

The PR layer 142 of the tri-layer photoresist 140 is then patterned. The patterned PR layer 142 exposes portions of the middle layer 144 disposed on the dummy semiconductor fins 112 of the fin group G2. Meanwhile, another portions of the middle layer 144 disposed on the dummy semiconductor fins 112 of the fin groups G1 and G3, the active semiconductor fins 114, and the OD pattern 116 are still covered by the PR layer 142. To pattern the tri-layer photoresist 140, the PR layer 142 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 142. This patterned PR layer 142 is then used to etch the underlying middle layer 144 and bottom layer 146 to form an etch mask for the target features; here, the dummy semiconductor fins 112 of the fin group G2.

Figure 1E:
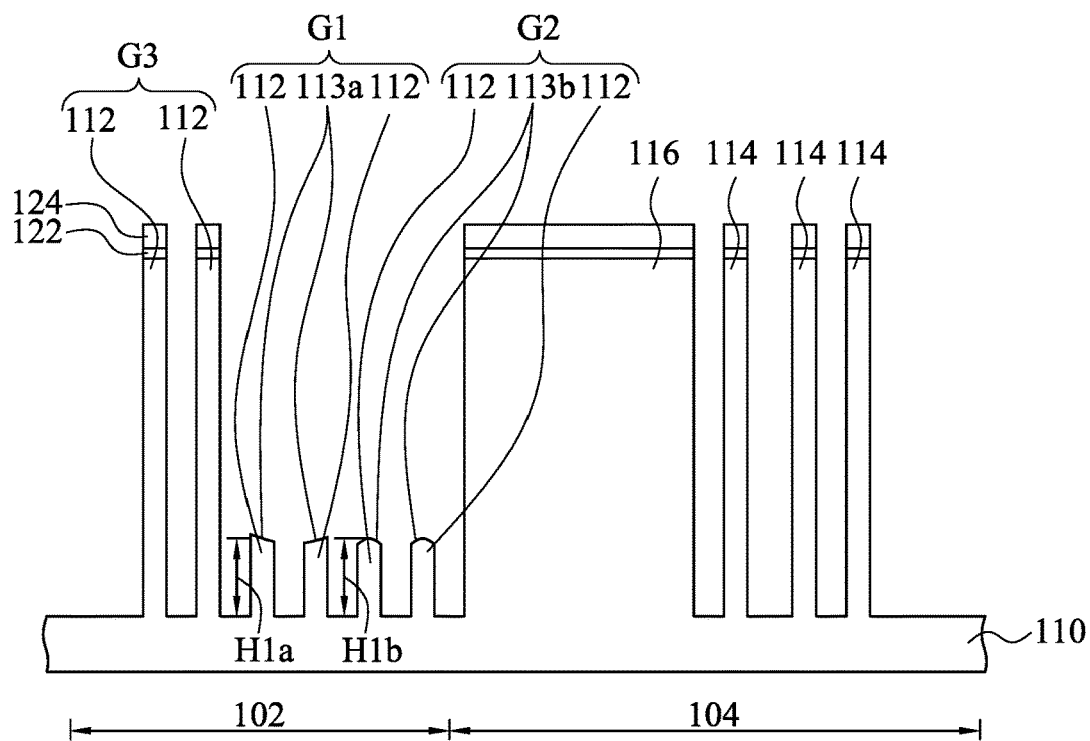

Reference is made to FIG. 1E. Using the patterned PR layer 142 (see FIG. 1D) as a mask, the middle layer 144 and the bottom layer 146 of the tri-layer photoresist 140 (see FIG. 1D) are etched by various methods, including a dry etch, a wet etch, or a combination of dry etch and wet etch. Then, portions of the mask layer 124 and the pad layer 122 (see FIG. 1D) disposed on the dummy semiconductor fins 112 of the fin group G2 are removed (or etched). Next, at least portions of the dummy semiconductor fins 112 of the fin group G2 are recessed (or etched or removed). The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple-step etching to gain etch selectivity, flexibility and desired etch profile. After the dummy semiconductor fins 112 of the fin group G2 are partially removed, the PR layer 142, the middle layer 144 and the bottom layer 146 of the tri-layer photoresist 140 are removed, for example, by ashing. The ashing operation such as a plasma ash removes the remaining tri-layer photoresist 140, and a wet clean may be performed to clean the etch residues.

In FIG. 1E, the heights H1b of the recessed dummy semiconductor fins 112 of the fin group G2 can be about 15 nm to about 30 nm. Moreover, the height difference between the recessed dummy semiconductor fins 112 of the fin group G2 and G1 is less than about 5 nm, or is less than about 2% of the height H2 of the active semiconductor fin 114 (see FIG. 1A). That is, the dummy semiconductor fins 112 have a height variation of less than about 5 nm. Or, the heights H1a and H1b are substantially the same. The terms "substantially" as used herein may be applied to modify any quantitative representation which could permissibly vary without resulting in a change in the basic function to which it is related.

The dummy semiconductor fins 112 of the fin group G2 respectively have top surfaces 113b. The top surfaces 113b can be non-concave, for example, convex or substantially flat. That is, the top surfaces 113b of the recessed dummy semiconductor fins 112 of the fin group G2 are curved outwardly. At least one of the top surfaces 113a of the recessed dummy semiconductor fins 112 of the fin group G1 and at least one of the top surfaces 113b of the recessed dummy semiconductor fins 112 of the fin group G2 are curved in different directions. For example, the top surfaces 113a of the recessed dummy semiconductor fins 112 of the fin group G1 are concave (or curved inwardly), and the top surfaces 113b of the recessed dummy semiconductor fins 112 of the fin group G2 are non-concave, such as convex (or curved outwardly) or substantially flat.

Figure 1F:
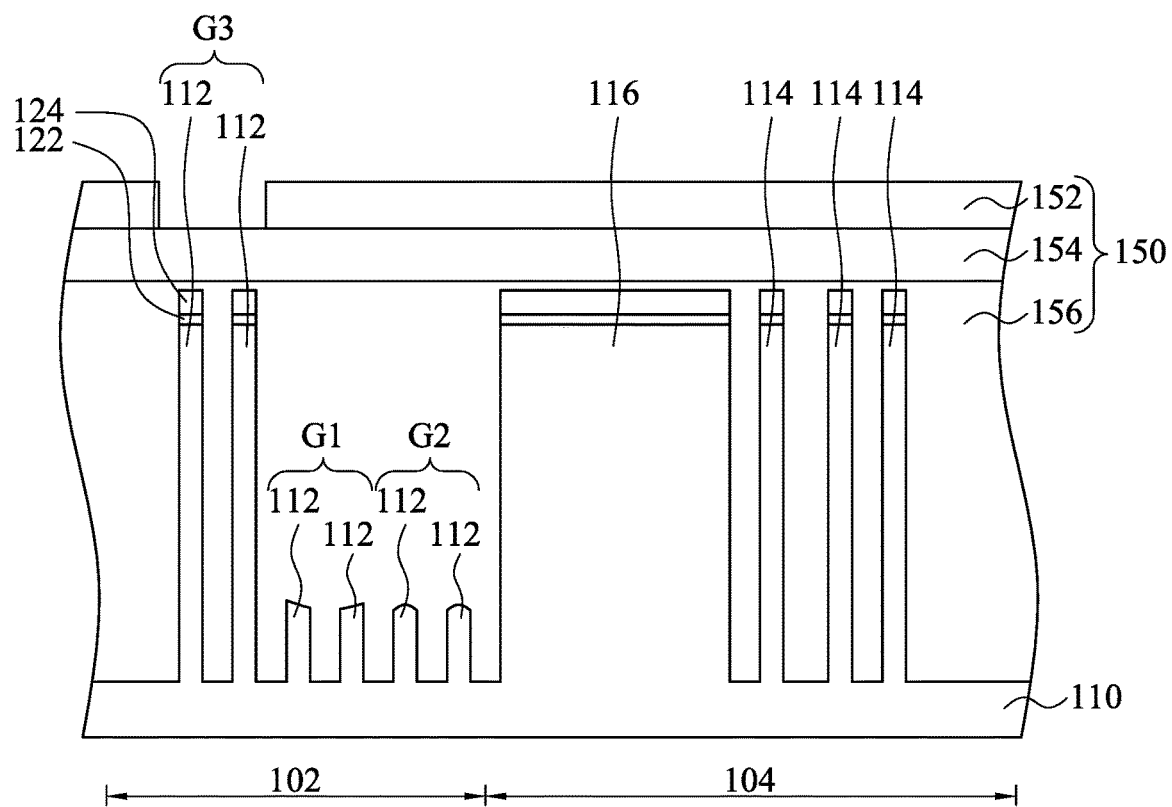

Reference is made to FIG. 1F. Still another tri-layer photoresist 150 may be used, including a photoresist (PR) layer 152 as the top or uppermost portion, a middle layer 154, and a bottom layer 156. The tri-layer photoresist 150 covers the dummy semiconductor fins 112, the active semiconductor fins 114, and the OD pattern 116. The tri-layer photoresist 150 provides the PR layer 152, the middle layer 154 which may include anti-reflective layers or backside anti-reflective layers to aid in the exposure and focus of the PR processing, and the bottom layer 156 which may be a hard mask material; for example, a nitride.

The PR layer 152 of the tri-layer photoresist 150 is then patterned. The patterned PR layer 152 exposes portions of the middle layer 154 disposed on the dummy semiconductor fins 112 of the fin group G3. Meanwhile, another portions of the middle layer 154 disposed on the dummy semiconductor fins 112 of the fin groups G1 and G2, the active semiconductor fins 114, and the OD pattern 116 are still covered by the PR layer 152. To pattern the tri-layer photoresist 150, the PR layer 152 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 152. This patterned PR layer 152 is then used to etch the underlying middle layer 154 and bottom layer 156 to form an etch mask for the target features; here, the dummy semiconductor fins 112 of the fin group G3.

Figure 1G:
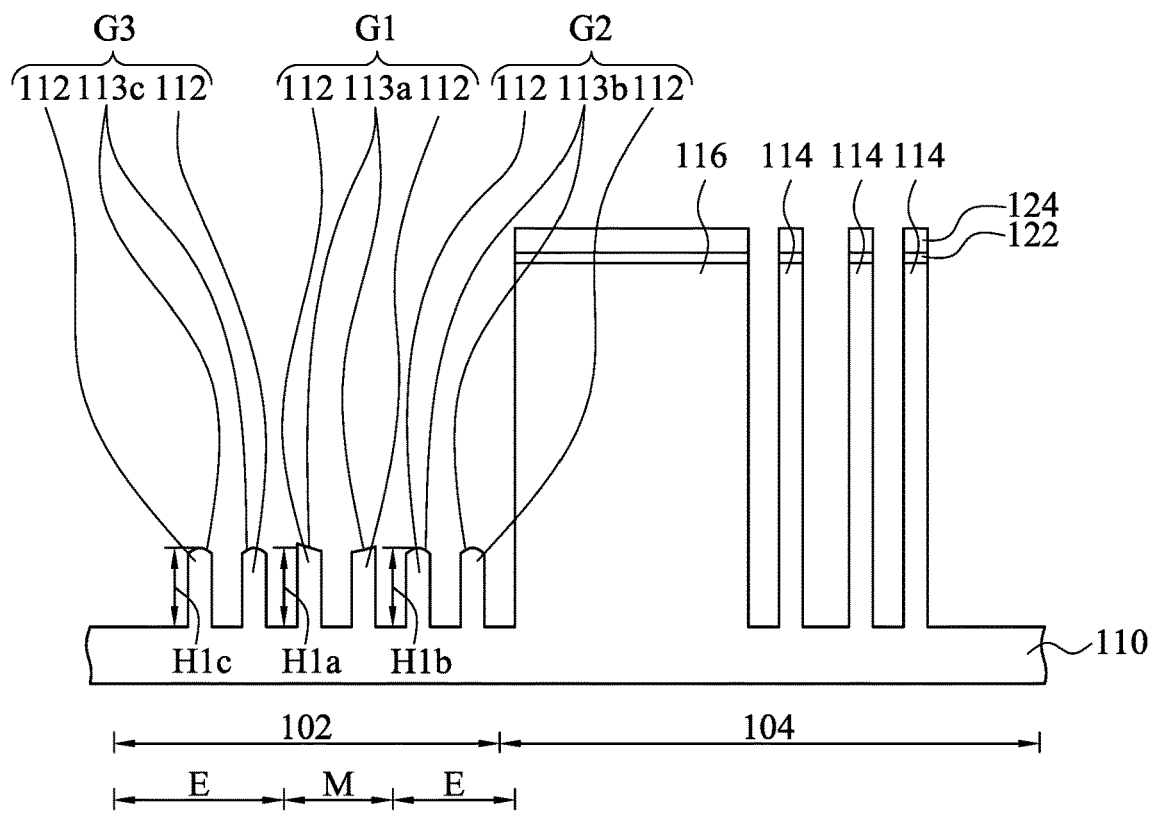

Reference is made to FIG. 1G. Using the patterned PR layer 152 (see FIG. 1F) as a mask, the middle layer 154 and the bottom layer 156 of the tri-layer photoresist 150 (see FIG. 1F) are etched by various methods, including a dry etch, a wet etch, or a combination of dry etch and wet etch. Then, portions of the mask layer 124 and the pad layer 122 (see FIG. 1F) disposed on the dummy semiconductor fins 112 of the fin group G3 are removed (or etched). Next, at least portions of the dummy semiconductor fins 112 of the fin group G3 are recessed (or etched or removed). The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple-step etching to gain etch selectivity, flexibility and desired etch profile. After the dummy semiconductor fins 112 of the fin group G3 are partially removed, the PR layer 152, the middle layer 154 and the bottom layer 156 of the tri-layer photoresist 150 are removed, for example, by ashing. The ashing operation such as a plasma ash removes the remaining tri-layer photoresist 150, and a wet clean may be performed to clean the etch residues.

Therefore, in FIGS. 1A to 1G, the dummy semiconductor fins 112 of the fin group disposed at the edge portion E (see FIG. 1H) of the isolation region 102 (i.e., the fin group G2 or G3) are recessed after the dummy semiconductor fins 112 of the fin group disposed at the middle portion M (see FIG. 1H) of the isolation region 102 (i.e., the fin group G1) are recessed.

In FIG. 1G, the heights H1$c$ of the recessed dummy semiconductor fins 112 of the fin group G3 can be about 15 nm to about 30 nm. Moreover, the height difference among the recessed dummy semiconductor fins 112 of the fin group G1, G2, and G3 is less than about 5 nm, or is less than about 2% of the height H2 of the active semiconductor fin 114 (see FIG. 1A). Or, the heights H1$a$, H1$b$, and H1$c$ are substantially the same. The terms "substantially" as used herein may be applied to modify any quantitative representation which could permissibly vary without resulting in a change in the basic function to which it is related.

The dummy semiconductor fins 112 of the fin group G3 respectively have top surfaces 113$c$. The top surfaces 113$c$ can be non-concave, for example, convex or substantially flat. That is, the top surfaces 113$c$ of the recessed dummy semiconductor fins 112 of the fin group G3 are curved outwardly. At least one of the top surfaces 113$a$ of the recessed dummy semiconductor fins 112 of the fin group G1 and at least one of the top surfaces 113$c$ of the recessed dummy semiconductor fins 112 of the fin group G3 are curved in different directions. For example, the top surfaces 113$a$ of the recessed dummy semiconductor fins 112 of the fin group G1 are concave (or curved inwardly), and the top surfaces 113$c$ of the recessed dummy semiconductor fins 112 of the fin group G3 are non-concave, such as convex (or curved outwardly) or substantially flat.

According to the aforementioned embodiments, the dummy semiconductor fins of different fin groups are removed (or etched or cut) one group at a time. Furthermore, for one time, at least two of the dummy semiconductor fins are removed. Such processes can prevent the features disposed on the active region of the substrate (e.g., the active semiconductor fins and the OD pattern) from being damaged during the removing processes of the dummy semiconductor fins. Also, such processes can obtain the recessed dummy semiconductor fins with substantially the same height. Furthermore, it is noted that although in FIGS. 1A to 1G, three etching processes are performed to recess the dummy semiconductor fins one group at a time, i.e., the dummy semiconductor fins are grouped (or divided) into three fin groups, the claimed scope of the present disclosure is not limited in this respect. In some other embodiments, embodiments fall within the claimed scope as long as the dummy semiconductor fins are grouped (or divided) into at least two fin groups, each of which includes at least adjacent two of the dummy semiconductor fins, and the fin groups are recessed one group at a time.

Figure 1H:
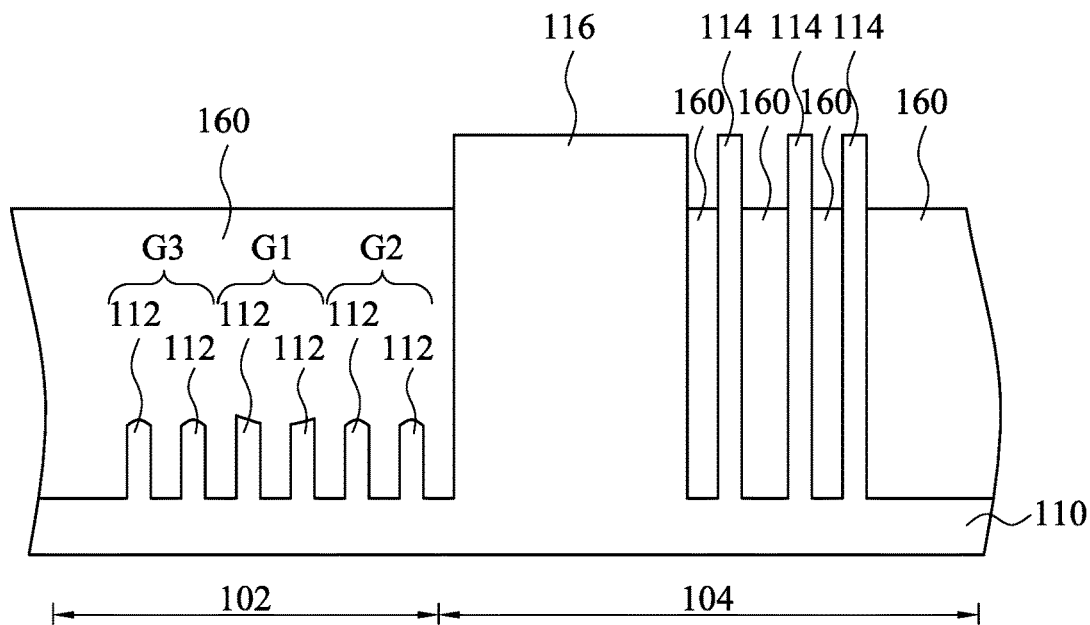

Reference is made to FIG. 1H. In some embodiments, at least one isolation structure 160 is formed to cover the recessed dummy semiconductor fins 112 while leave the active semiconductor fins 114 and the OD pattern 116 uncovered. That is, the recessed dummy semiconductor fins 112 are embedded under the isolation structure 160. The active semiconductor fins 114 can be source/drain features of at least one fin field effect transistor (finFET).

In some embodiments, the isolation structure 160 includes silicon oxide, silicon nitride, silicon oxynitride, other suitable materials, or combinations thereof. The isolation structure 160 is formed by suitable process. For example, the isolation structure 160 is formed by filling the trench between the semiconductor features (i.e., the dummy semiconductor fins 112, the active semiconductor fins 114, and the OD pattern 116) with one or more dielectric materials by using a chemical vapor deposition (CVD). In some embodiments, the isolation structure 160 may have a multi-layer structure such as a thermal oxide liner layer filled with silicon nitride or silicon oxide. At least one annealing process may be performed after the formation of the isolation structure 160. In some embodiments, the pad layer 122 and the mask layer 124 (see FIG. 1G) can be removed during the formation process of the isolation structure 160.

After forming the isolation structure 160, the semiconductor device may undergo further CMOS or MOS technology processing to form various features and regions. For example, further fabrication processes may include, among other things, forming a gate structure on the substrate 110, including on a portion of the active semiconductor fins 116 and forming source and drain (S/D) regions on opposite sides of the gate structure, including another portion of the active semiconductor fins 116. The formation of the gate structure may include depositing, patterning, and etching processes. A gate spacer may be formed on the walls of the gate structure by deposition and etching techniques. S/D regions may be formed by recess, epitaxially growing and implant techniques. Additional processes can be provided before, during, and after the processes mentioned above, and some of the processes described can be replaced or eliminated for other embodiments of the method.

Subsequent processing may also form various contacts/vias/lines and multilayer interconnect features (e.g., metal layers and interlayer dielectrics) on the substrate 110, configured to connect the various features or structures of the semiconductor device. For example, a multilayer interconnection includes vertical interconnects, such as conventional vias or contacts, and horizontal interconnects, such as metal lines. The various interconnection features may implement various conductive materials including copper, tungsten, and/or silicide. In some embodiments, a damascene and/or dual damascene process is used to form a copper related multilayer interconnection structure.

Figure 2A:
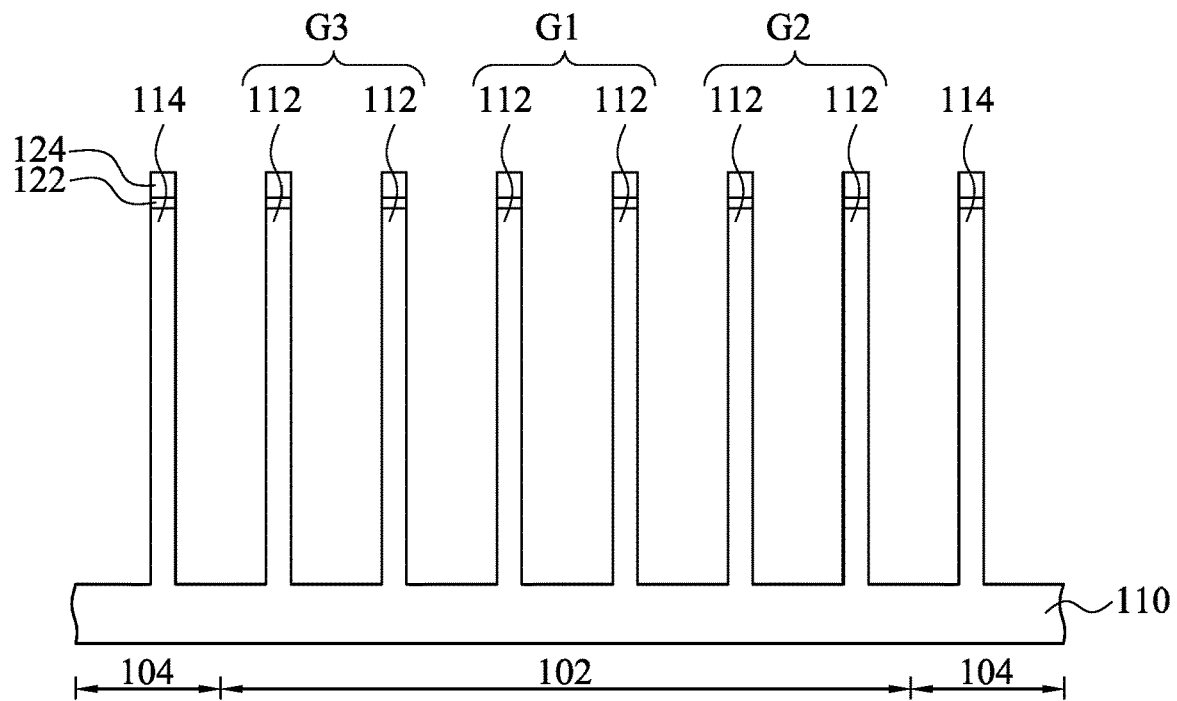
FIGS. 2A to 2E are cross-sectional views of a method for manufacturing a semiconductor device at various stages in accordance with some embodiments of the present disclosure.

FIGS. 2A to 2E are cross-sectional views of a method for manufacturing a semiconductor device at various stages in accordance with some embodiments of the present disclosure. Reference is made to FIG. 2A. A substrate 110 is provided. The substrate 110 has one isolation region 102 and two active regions 104, where the isolation region 102 is disposed between the two active regions 104.

Three fin groups G1, G2, and G3 are formed on the dummy region 104 of the substrate 110. The fin groups G1, G2, and G3 are adjacent to each other. For example, in FIG. 2A, the fin group G1 is disposed between the fin groups G2 and G3. The fin groups G1, G2, and G3 respectively include two adjacent dummy semiconductor fins 112. Moreover, at least two active semiconductor fins 114 are respectively formed on the active regions 104 of the substrate 110. That is, the dummy semiconductor fins 112 are disposed between the two active semiconductor fins 114. The active semiconductor fins 114 can be formed with the dummy semiconductor fins 112.

Figure 2B:
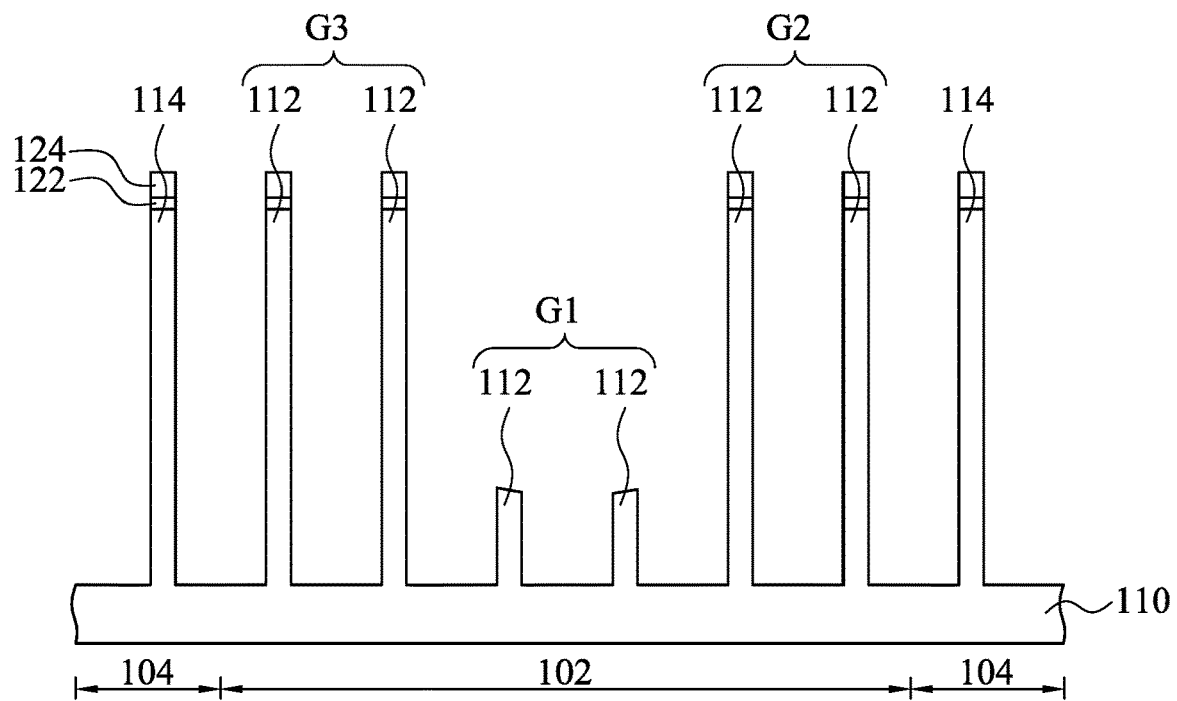

Reference is made to FIG. 2B. The dummy semiconductor fins 112 of the fin group G1 is recessed. The recessing details are similar to the processes of FIGS. 1B to 1C, and, therefore, a description in this regard will not be repeated hereinafter.

Figure 2C:
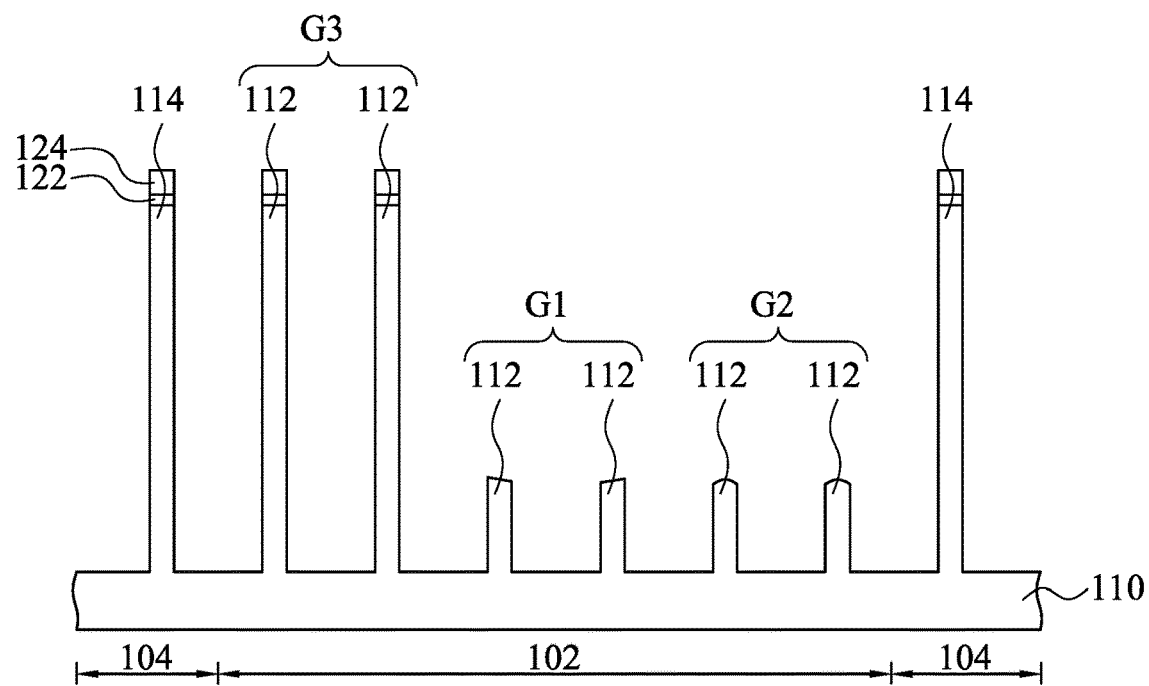

Reference is made to FIG. 2C. The dummy semiconductor fins 112 of the fin group G2 is recessed. The recessing details are similar to the processes of FIGS. 1D to 1E, and, therefore, a description in this regard will not be repeated hereinafter.

Figure 2D:
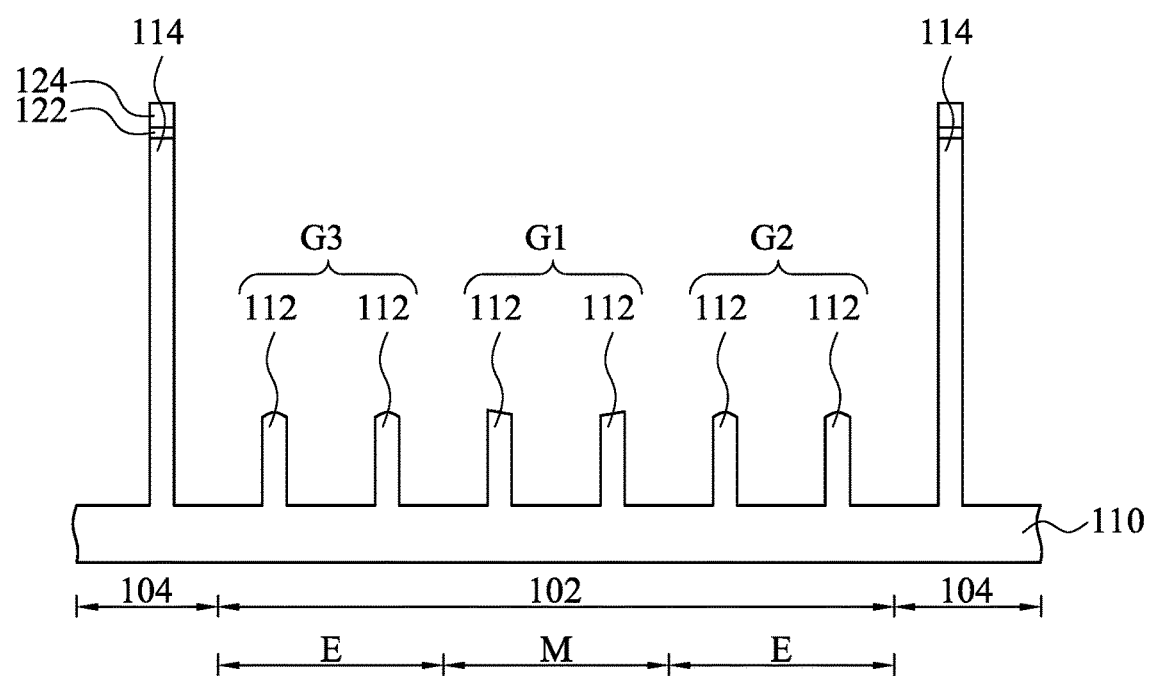

Reference is made to FIG. 2D. The dummy semiconductor fins 112 of the fin group G3 is recessed. The recessing details are similar to the processes of FIGS. 1F to 1G, and, therefore, a description in this regard will not be repeated hereinafter. Therefore, in FIGS. 2A to 2D, the dummy semiconductor fins 112 of the fin group disposed at the edge portion E (see FIG. 2D) of the isolation region 102 (i.e., the fin group G2 or G3) are recessed after the dummy semiconductor fins 112 of the fin group disposed at the middle portion (see FIG. 2D) of the isolation region 102 (i.e., the fin group G1) are recessed.

Figure 2E:
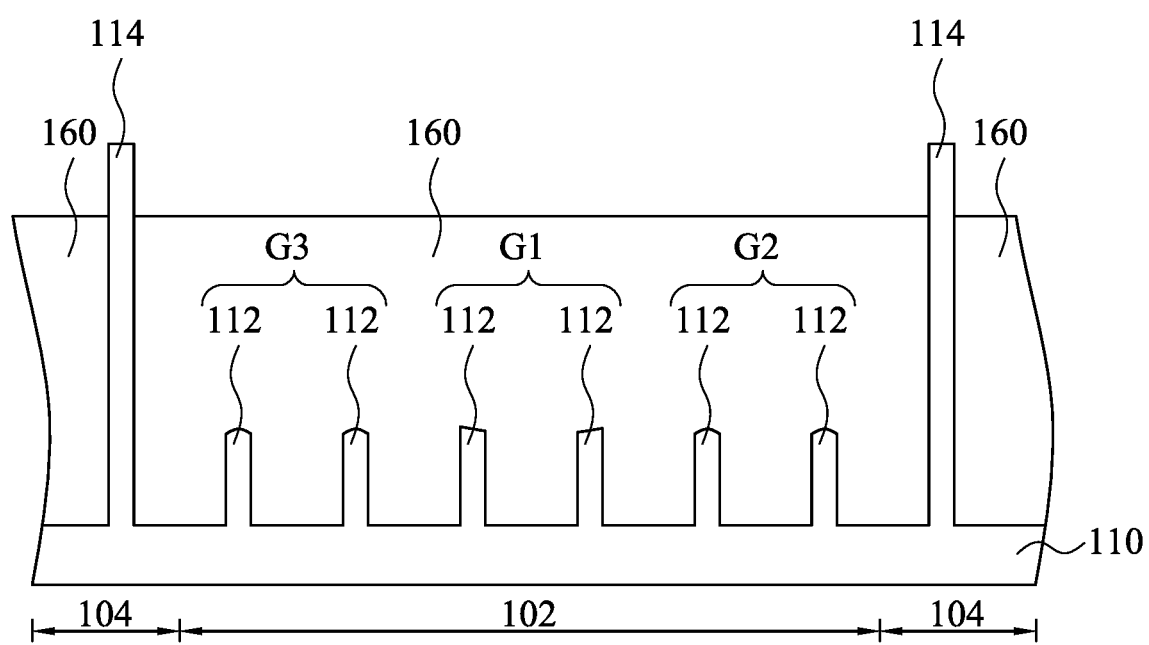

Reference is made to FIG. 2E. At least one isolation structure 160 is formed to cover the recessed dummy semiconductor fins 112 while leave the active semiconductor fins 114 uncovered. That is, the recessed dummy semiconductor fins 112 are embedded under the isolation structure 160. The active semiconductor fins 114 can be source/drain features of at least one fin field effect transistor (finFET). The forming details are similar to the processes of FIG. 1H, and, therefore, a description in this regard will not be repeated hereinafter. Other relevant structural details of the semiconductor device of FIGS. 2A to 2E are similar to the semiconductor device of FIGS. 1A to 1H, and, therefore, a description in this regard will not be repeated hereinafter.

Figure 3A:
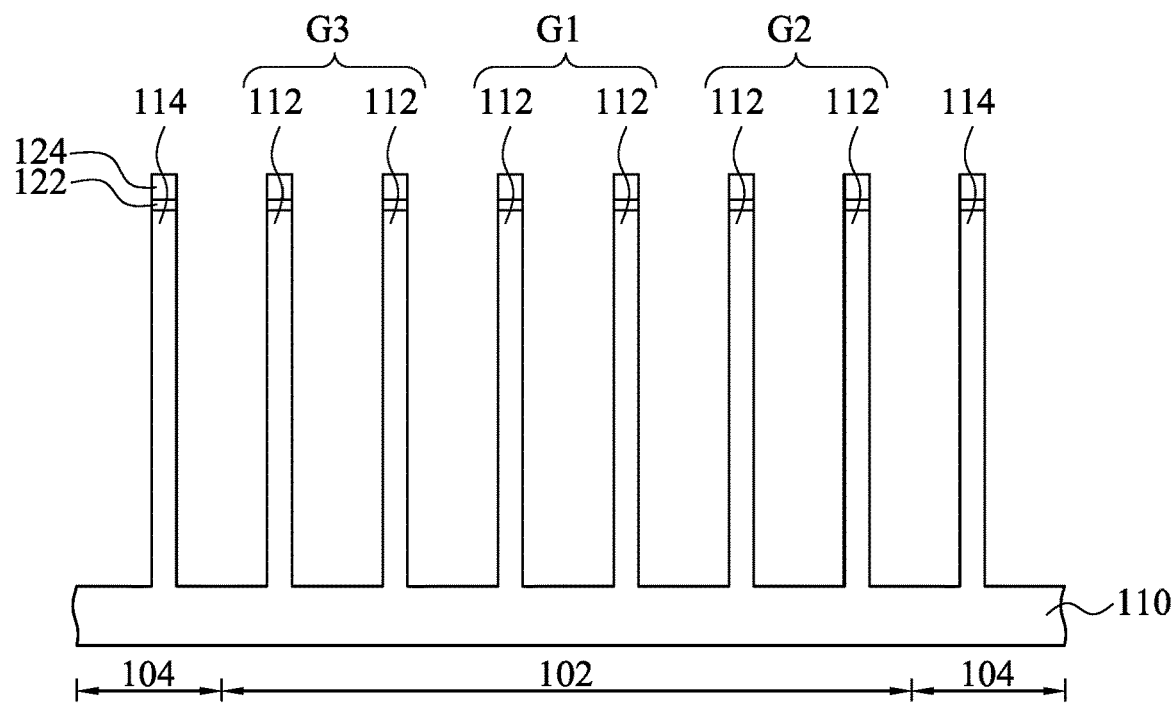
FIGS. 3A to 3E are cross-sectional views of a method for manufacturing a semiconductor device at various stages in accordance with some embodiments of the present disclosure.

FIGS. 3A to 3E are cross-sectional views of a method for manufacturing a semiconductor device at various stages in accordance with some embodiments of the present disclosure. Reference is made to FIG. 3A. A substrate 110 is provided. Three fin groups G1, G2, and G3 are formed on the dummy region 104 of the substrate 110. Since the structural details of the substrate and the fin groups G1, G2, and G3 are similar to FIG. 2A, and, therefore, a description in this regard will not be repeated hereinafter.

Figure 3B:
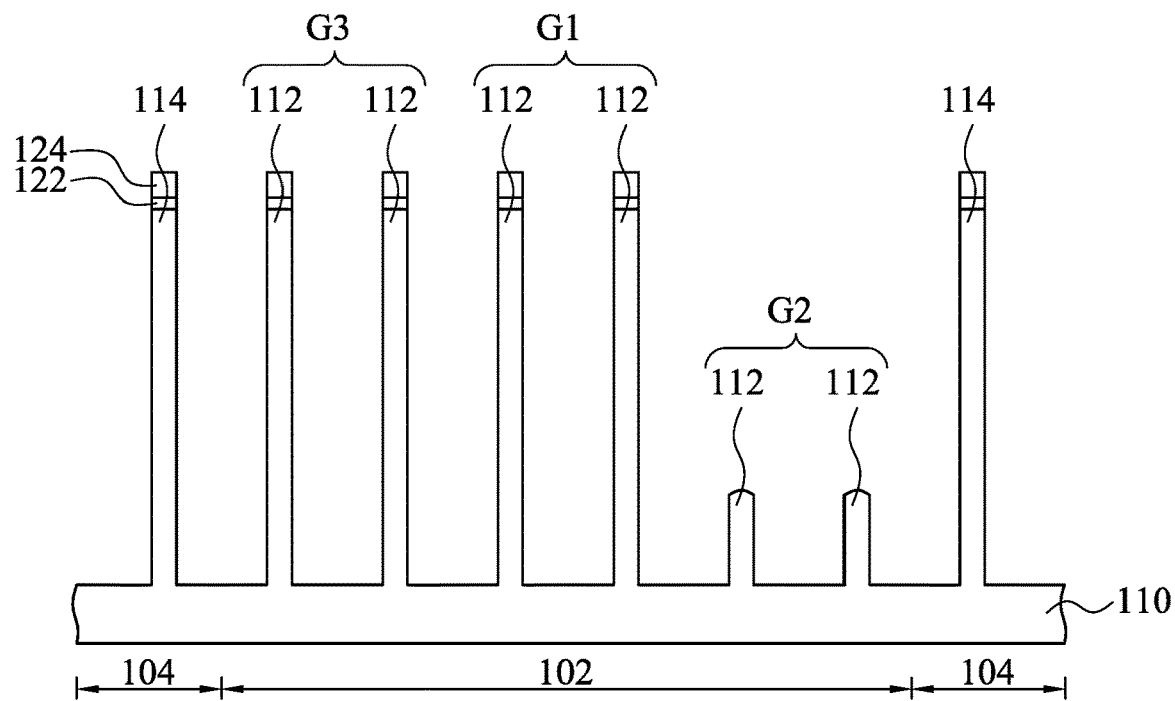

Reference is made to FIG. 3B. The dummy semiconductor fins 112 of the fin group G2 is recessed. The recessing details are similar to the processes of FIGS. 1D to 1E, and, therefore, a description in this regard will not be repeated hereinafter.

Figure 3C:
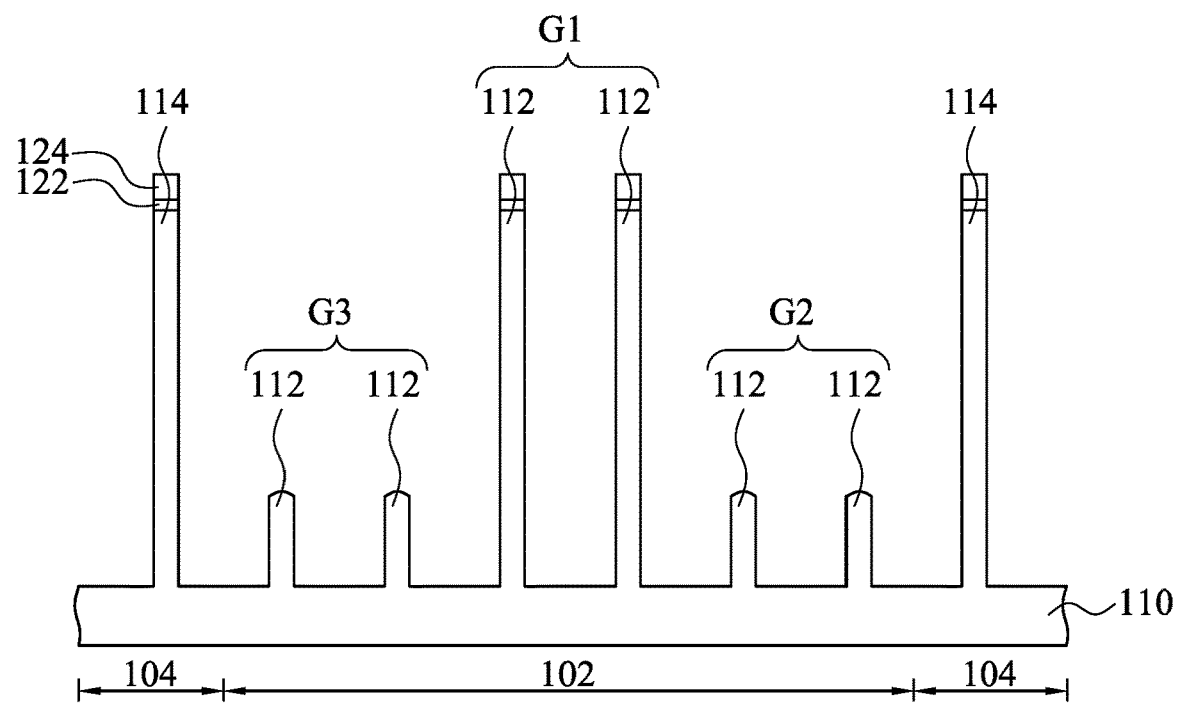

Reference is made to FIG. 3C. The dummy semiconductor fins 112 of the fin group G3 is recessed. The recessing details are similar to the processes of FIGS. 1F to 1G, and, therefore, a description in this regard will not be repeated hereinafter.

Figure 3D:
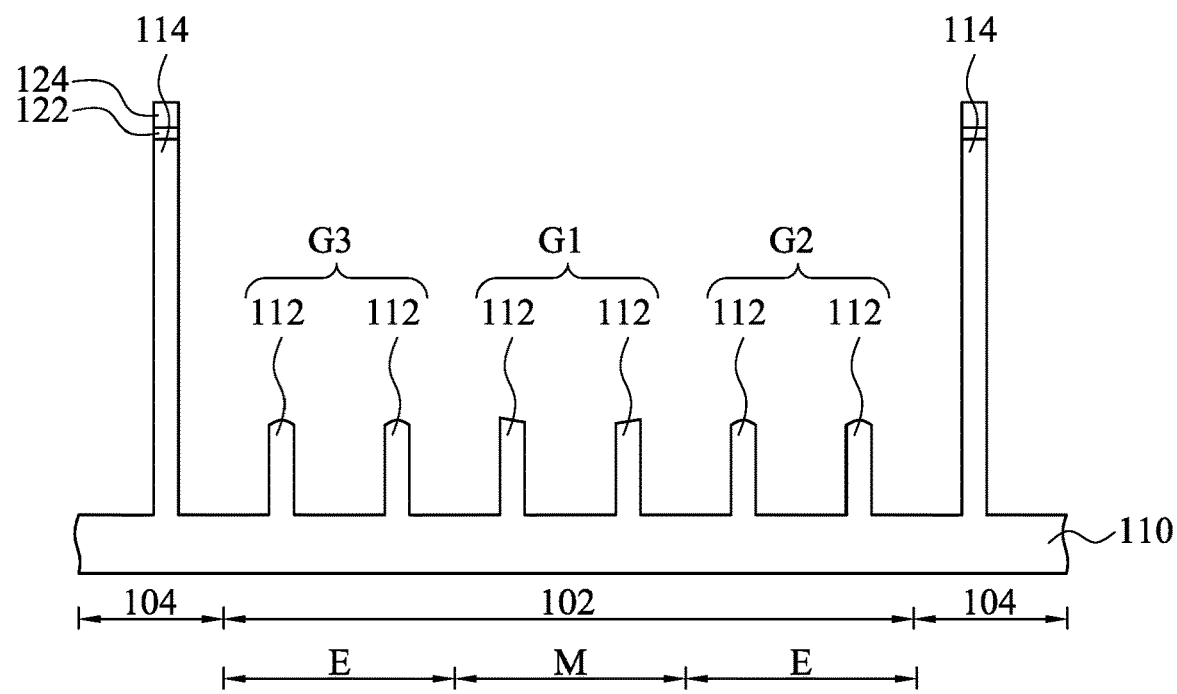

Reference is made to FIG. 3D. The dummy semiconductor fins 112 of the fin group G1 is recessed. The recessing details are similar to the processes of FIGS. 1B to 1C, and, therefore, a description in this regard will not be repeated hereinafter. Therefore, in FIGS. 3A to 3D, the dummy semiconductor fins 112 of the fin group disposed at the edge portion E (see FIG. 3D) of the isolation region 102 (i.e., the fin group G2 or G3) are recessed before the dummy semiconductor fins 112 of the fin group disposed at the middle portion M (see FIG. 3D) of the isolation region 102 (i.e., the fin group G1) are recessed.

Figure 3E:
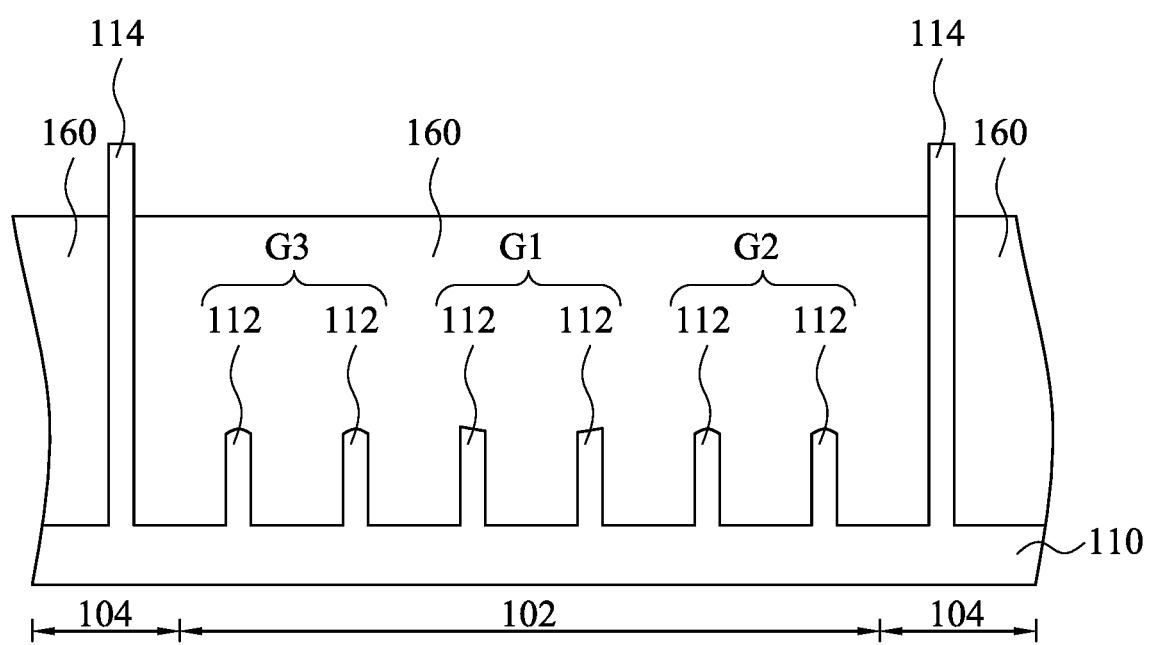

Reference is made to FIG. 3E. At least one isolation structure 160 is formed to cover the recessed dummy semiconductor fins 112 while leave the active semiconductor fins 114 uncovered. That is, the recessed dummy semiconductor fins 112 are embedded under the isolation structure 160. The active semiconductor fins 114 can be source/drain features of at least one fin field effect transistor (finFET). The forming details are similar to the processes of FIG. 1H, and, therefore, a description in this regard will not be repeated hereinafter. Other relevant structural details of the semiconductor device of FIGS. 3A to 3E are similar to the semiconductor device of FIGS. 1A to 1H, and, therefore, a description in this regard will not be repeated hereinafter.

Figure 4A:
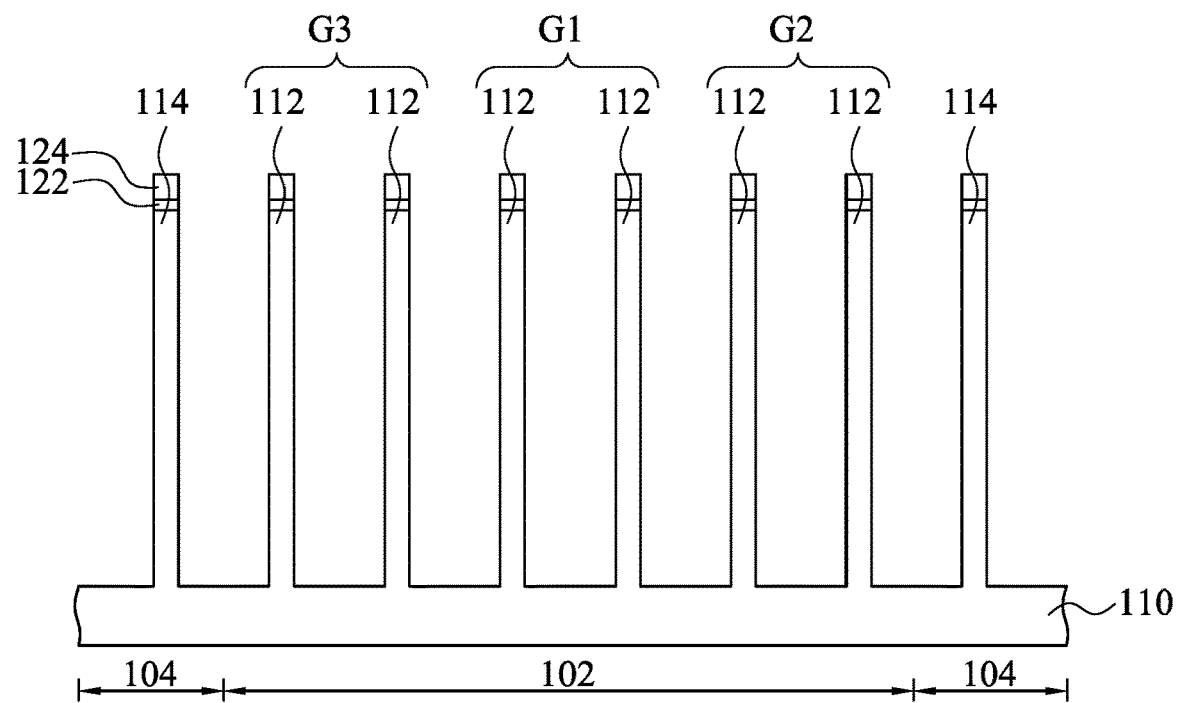
FIGS. 4A to 4E are cross-sectional views of a method for manufacturing a semiconductor device at various stages in accordance with some embodiments of the present disclosure.

FIGS. 4A to 4E are cross-sectional views of a method for manufacturing a semiconductor device at various stages in accordance with some embodiments of the present disclosure. Reference is made to FIG. 4A. A substrate 110 is provided. Three fin groups G1, G2, and G3 are formed on the dummy region 104 of the substrate 110. Since the structural details of the substrate and the fin groups G1, G2, and G3 are similar to FIG. 2A, and, therefore, a description in this regard will not be repeated hereinafter.

Figure 4B:
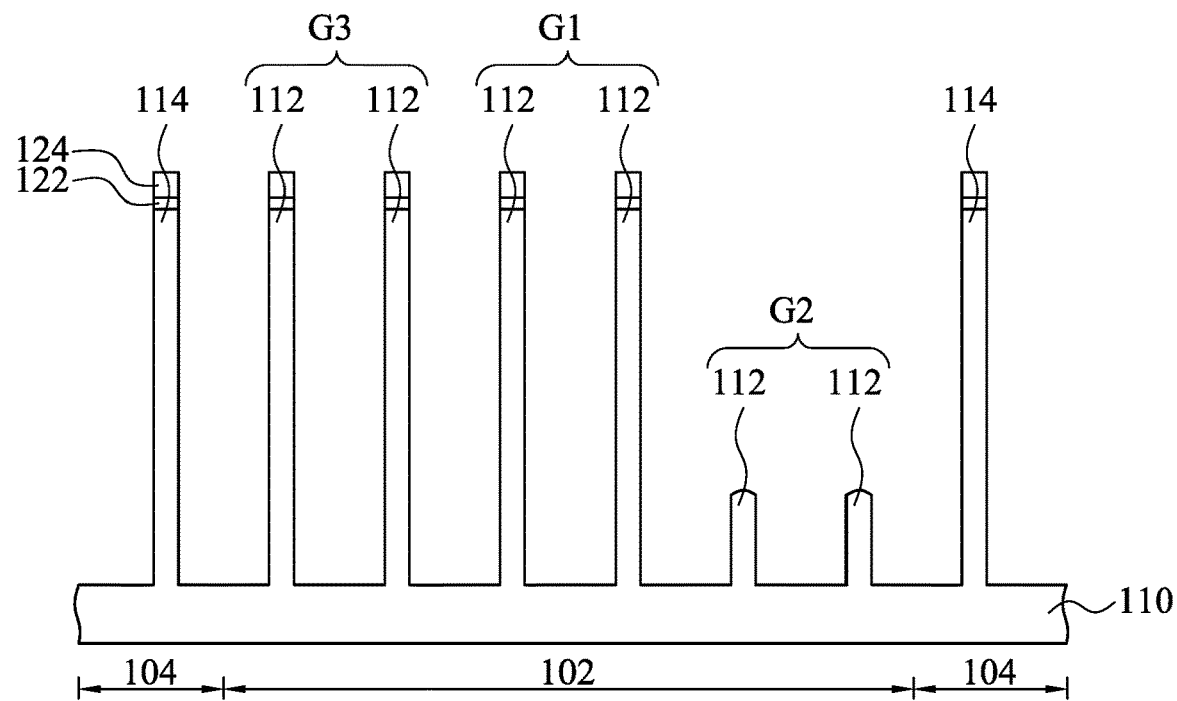

Reference is made to FIG. 4B. The dummy semiconductor fins 112 of the fin group G2 is recessed. The recessing details are similar to the processes of FIGS. 1D to 1E, and, therefore, a description in this regard will not be repeated hereinafter.

Figure 4C:
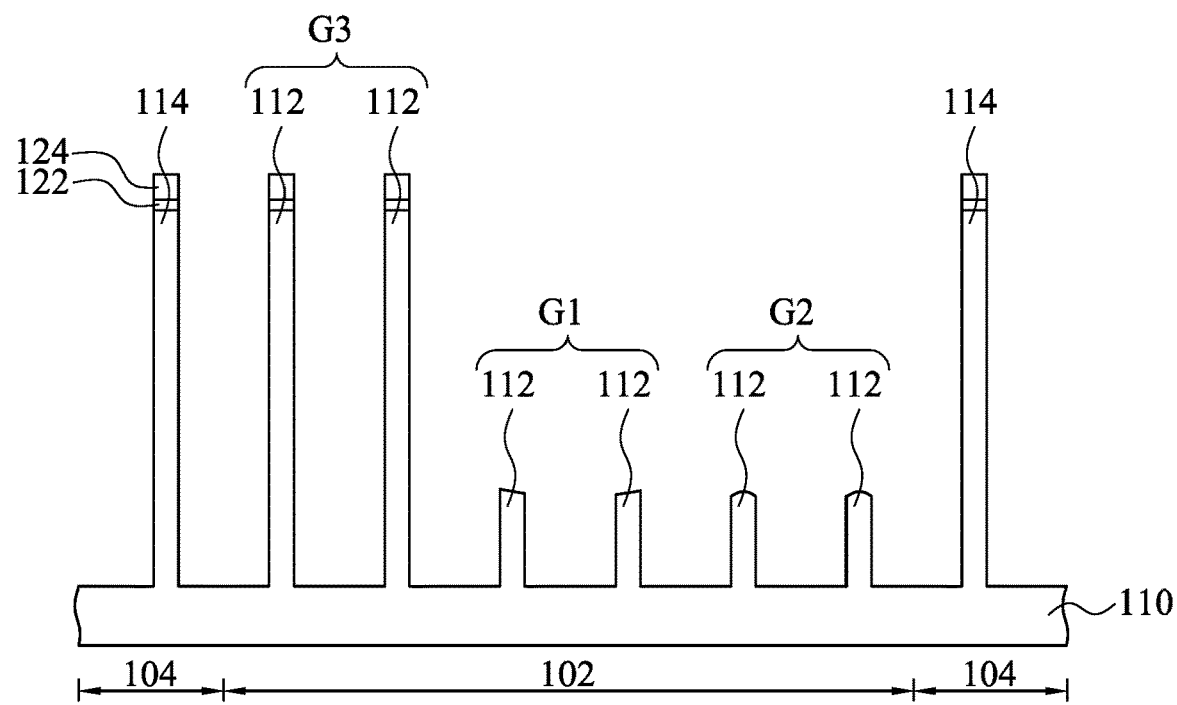

Reference is made to FIG. 4C. The dummy semiconductor fins 112 of the fin group G1 is recessed. The recessing details are similar to the processes of FIGS. 1B to 1C, and, therefore, a description in this regard will not be repeated hereinafter.

Figure 4D:
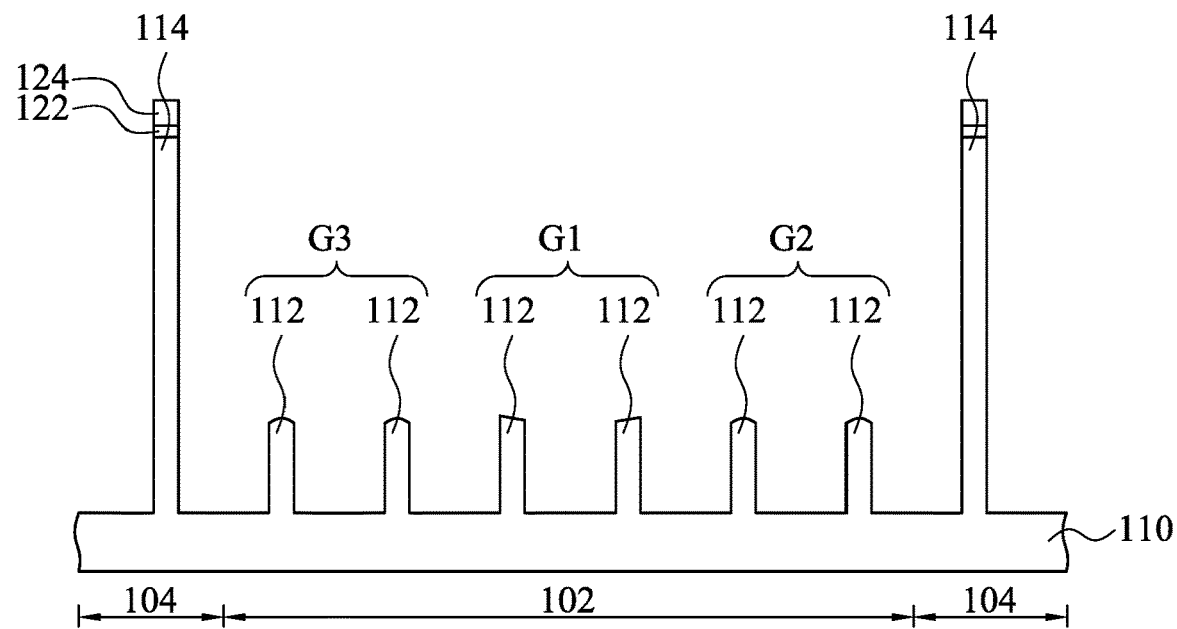

Reference is made to FIG. 4D. The dummy semiconductor fins 112 of the fin group G3 is recessed. The recessing details are similar to the processes of FIGS. 1F to 1G, and, therefore, a description in this regard will not be repeated hereinafter.

Figure 4E:
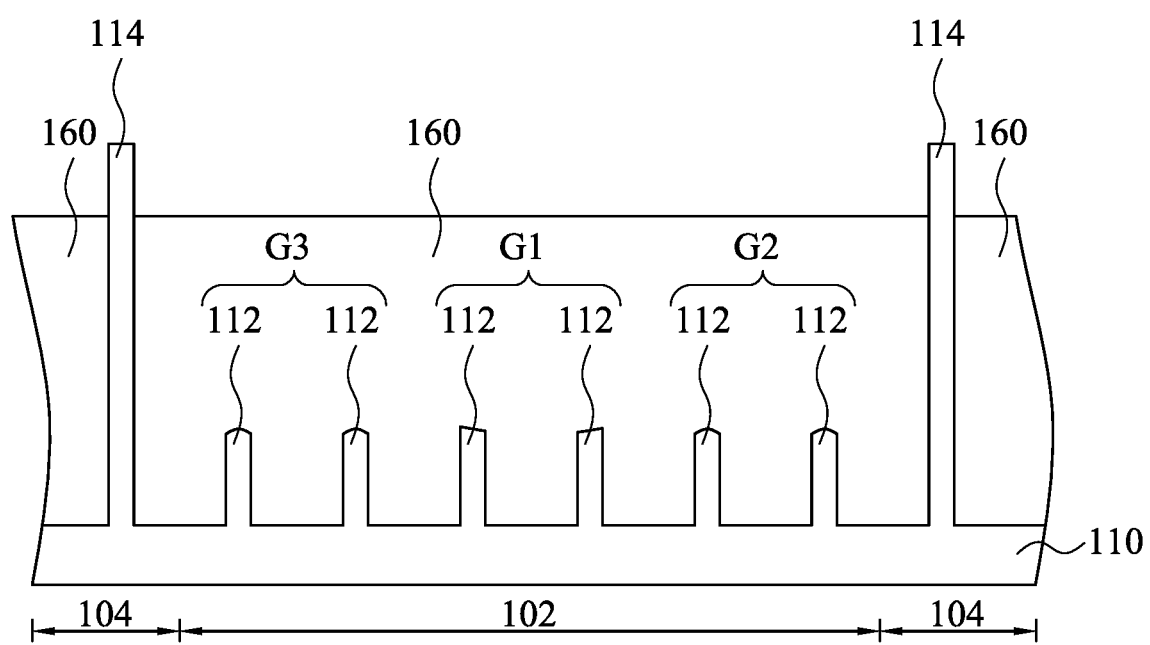

Reference is made to FIG. 4E. At least one isolation structure 160 is formed to cover the recessed dummy semiconductor fins 112 while leave the active semiconductor fins 114 uncovered. That is, the recessed dummy semiconductor fins 112 are embedded under the isolation structure 160. The active semiconductor fins 114 can be source/drain features of at least one fin field effect transistor (finFET). The forming details are similar to the processes of FIG. 1H, and, therefore, a description in this regard will not be repeated hereinafter. Other relevant structural details of the semiconductor device of FIGS. 4A to 4E are similar to the semiconductor device of FIGS. 1A to 1H, and, therefore, a description in this regard will not be repeated hereinafter.

Figure 5A:
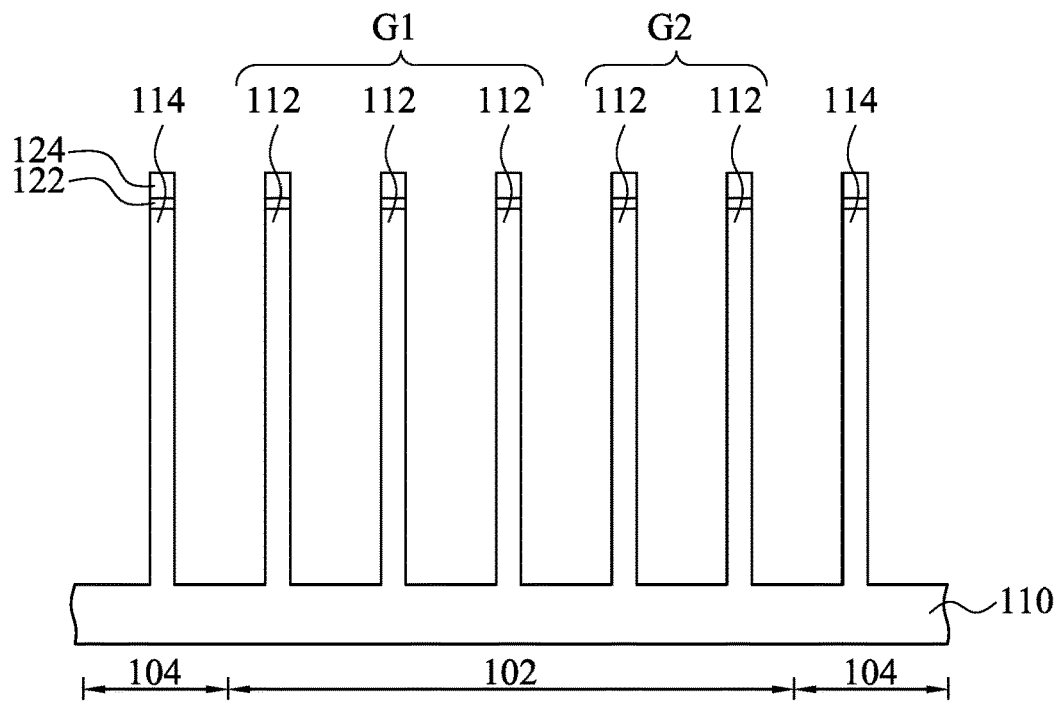
FIGS. 5A to 5D are cross-sectional views of a method for manufacturing a semiconductor device at various stages in accordance with some embodiments of the present disclosure.

FIGS. 5A to 5D are cross-sectional views of a method for manufacturing a semiconductor device at various stages in accordance with some embodiments of the present disclosure. Reference is made to FIG. 5A. A substrate 110 is provided. The substrate 110 has one isolation region 102 and two active regions 104, where the isolation region 102 is disposed between the two active regions 104.

Two fin groups G1 and G2 are formed on the dummy region 104 of the substrate 110. The fin groups G1 and G2 are adjacent to each other. The fin groups G1 and G2 respectively include at least two adjacent dummy semiconductor fins 112. For example, the fin group G1 includes three of the dummy semiconductor fins 112, and the fin group G2 includes two of the dummy semiconductor fins 112. Moreover, two active semiconductor fins 114 are respectively formed on the active regions 104 of the substrate 110. That is, the dummy semiconductor fins 112 are disposed between the two active semiconductor fins 114. The active semiconductor fins 114 can be formed with the dummy semiconductor fins 112.

Figure 5B:
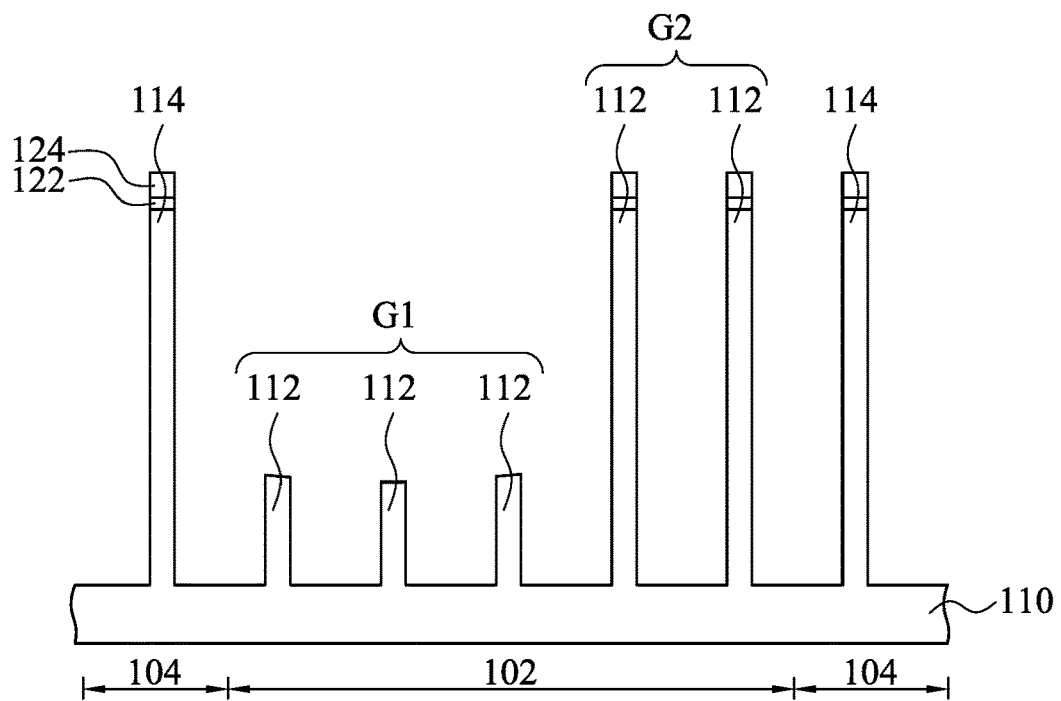

Reference is made to FIG. 5B. The dummy semiconductor fins 112 of the fin group G1 is recessed. The recessing details are similar to the processes of FIGS. 1B to 1C, and, therefore, a description in this regard will not be repeated hereinafter.

Figure 5C:
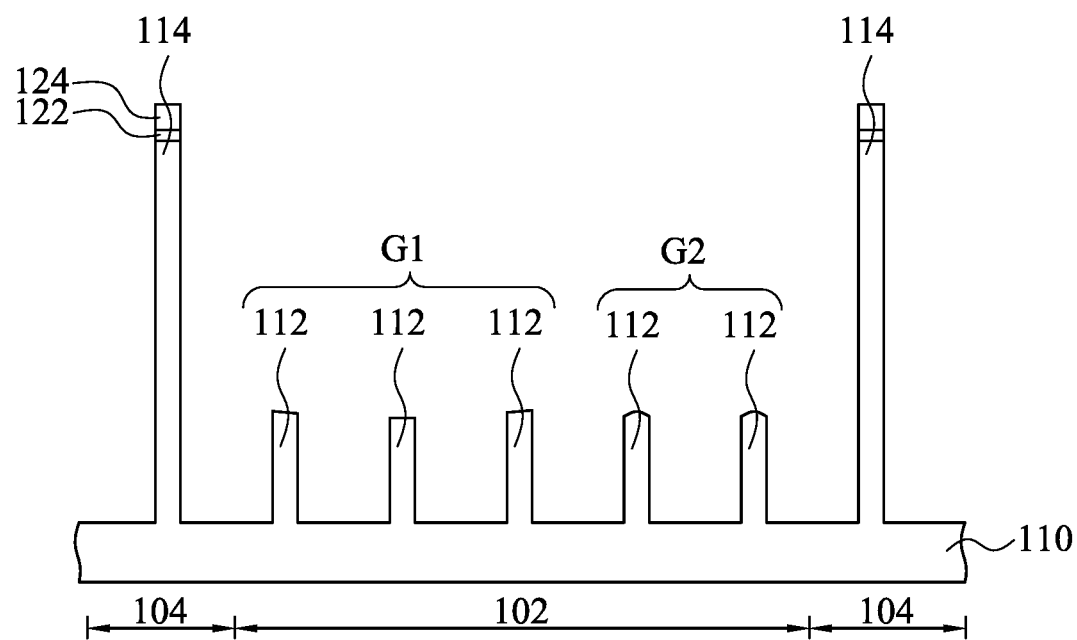

Reference is made to FIG. 5C. The dummy semiconductor fins 112 of the fin group G2 is recessed. The recessing details are similar to the processes of FIGS. 1D to 1E, and, therefore, a description in this regard will not be repeated hereinafter.

Figure 5D:
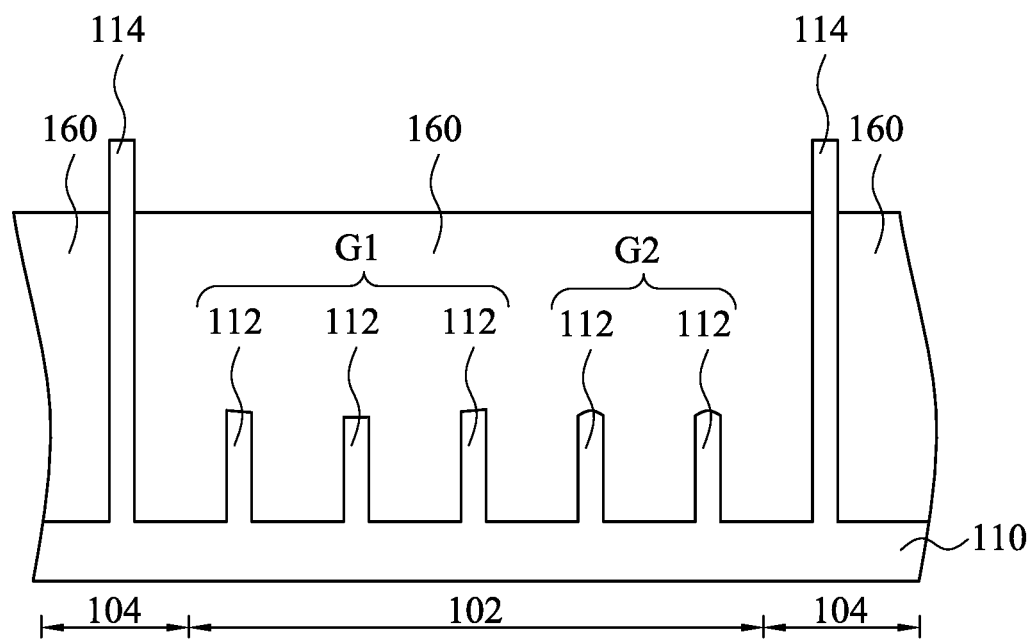

Reference is made to FIG. 5D. At least one isolation structure 160 is formed to cover the recessed dummy semiconductor fins 112 while leave the active semiconductor fins 114 uncovered. That is, the recessed dummy semiconductor fins 112 are embedded under the isolation structure 160. The active semiconductor fins 114 can be source/drain features of at least one fin field effect transistor (finFET). The forming details are similar to the processes of FIG. 1H, and, therefore, a description in this regard will not be repeated hereinafter. Other relevant structural details of the semiconductor device of FIGS. 5A to 5D are similar to the semiconductor device of FIGS. 1A to 1H, and, therefore, a description in this regard will not be repeated hereinafter.

According to some embodiments, a method for manufacturing a semiconductor structure includes forming a plurality of dummy semiconductor fins on a substrate. The dummy semiconductor fins are adjacent to each other and are grouped into a plurality of fin groups. The dummy semiconductor fins of the fin groups are recessed one group at a time.

According to some embodiments, a method for manufacturing a semiconductor structure includes forming a first fin group and a second fin group on a substrate. The first fin group is disposed adjacent to the second fin group. The first fin group includes at least two adjacent first dummy semiconductor fins, and the second fin group includes at least two adjacent second dummy semiconductor fins. The first dummy semiconductor fins of the first fin group are recessed. The second dummy semiconductor fins of the second fin group are recessed. The recessing the first dummy semiconductor fins of the first fin group and the recessing the second dummy semiconductor fins of the second fin group are performed separately.

According to some embodiments, a semiconductor substrate includes a substrate, at least one active structure, and a plurality of dummy semiconductor fins. The active structure is disposed on the substrate. The dummy semiconductor fins are disposed on the substrate and adjacent to the active structure. The dummy semiconductor fins are shorter than the active structure, and the dummy semiconductor fins has a high variation of less than about 5 nm.

According to some embodiments, a method includes forming a plurality of dummy semiconductor fins on a substrate. The plurality of dummy semiconductor fins are adjacent to each other and are grouped into a plurality of fin groups. The plurality of dummy semiconductor fins of the plurality of fin groups are recessed one group at a time. First dummy semiconductor fins of a first fin group of the plurality of fin groups have concave topmost surfaces after the recessing. Second dummy semiconductor fins of a second fin group of the plurality of fin groups have convex topmost surfaces after the recessing. Third dummy semiconductor fins of a third fin group of the plurality of fin groups have convex topmost surfaces after the recessing. The first fin group is interposed between the second fin group and the third fin group.

According to some embodiments, a method includes forming a first fin group and a second fin group on a substrate. The first fin group is disposed adjacent to the second fin group. The first fin group includes at least two adjacent first dummy semiconductor fins. The second fin group includes at least two adjacent second dummy semiconductor fins. The at least two adjacent first dummy semiconductor fins of the first fin group are recessed. The at least two adjacent second dummy semiconductor fins of the second fin group are recessed. Recessing the at least two adjacent first dummy semiconductor fins of the first fin group and recessing the at least two adjacent second dummy semiconductor fins of the second fin group are performed separately. The at least two adjacent first dummy semiconductor fins of the first fin group have concave topmost surfaces after recessing the at least two adjacent first dummy semiconductor fins of the first fin group. The at least two adjacent second dummy semiconductor fins of the second fin group have convex topmost surfaces after recessing the at least two adjacent second dummy semiconductor fins of the second fin group.

According to some embodiments, a method includes performing a first etching process on a substrate to form a plurality of dummy semiconductor fins. A second etching process is performed on a first dummy semiconductor fin of the plurality of dummy semiconductor fins. The first dummy semiconductor fin has a concave topmost surface after completing the second etching process. A third etching process is performed on a second dummy semiconductor fin of the plurality of dummy semiconductor fins. The second dummy semiconductor fin has a convex topmost surface after completing the third etching process. An isolation structure is formed over the plurality of dummy semiconductor fins. A topmost surface of the isolation structure is above the concave topmost surface of the first dummy semiconductor fin and the convex topmost surface of the second dummy semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a plurality of dummy semiconductor fins on a substrate, wherein the plurality of dummy semiconductor fins are adjacent to each other and are grouped into a plurality of fin groups; and
   recessing the plurality of dummy semiconductor fins of the plurality of fin groups one group at a time, first dummy semiconductor fins of a first fin group of the plurality of fin groups having concave topmost surfaces after the recessing, second dummy semiconductor fins of a second fin group of the plurality of fin groups having convex topmost surfaces after the recessing, third dummy semiconductor fins of a third fin group of the plurality of fin groups having convex topmost surfaces after the recessing, the first fin group being interposed between the second fin group and the third fin group.

2. The method of claim 1, further comprising:
after recessing the plurality of dummy semiconductor fins, forming an isolation structure to cover the plurality of dummy semiconductor fins.

3. The method of claim 1, wherein recessing the plurality of dummy semiconductor fins comprises:
forming an anti-reflective layer to cover the plurality of dummy semiconductor fins;
forming a patterned mask on the anti-reflective layer, wherein the patterned mask exposes a portion of the anti-reflective layer disposed on one of the plurality of fin groups; and
recessing the portion of the anti-reflective layer and corresponding dummy semiconductor fins of the one of the plurality of fin groups exposed by the patterned mask.

4. The method of claim 1, wherein the plurality of dummy semiconductor fins have substantially the same height after recessing the plurality of dummy semiconductor fins.

5. The method of claim 1, wherein recessing the plurality of dummy semiconductor fins comprises:
recessing the first dummy semiconductor fins of the first fin group; and
after recessing the first dummy semiconductor fins, recessing the second dummy semiconductor fins of the second fin group.

6. The method of claim 1, wherein recessing the plurality of dummy semiconductor fins comprises:
recessing the second dummy semiconductor fins of the second fin group; and
after recessing the second dummy semiconductor fins, recessing the first dummy semiconductor fins of the first fin group.

7. A method comprising:
forming a first fin group and a second fin group on a substrate, the first fin group being disposed adjacent to the second fin group, the first fin group comprising at least two adjacent first dummy semiconductor fins, the second fin group comprising at least two adjacent second dummy semiconductor fins;
recessing the at least two adjacent first dummy semiconductor fins of the first fin group; and
recessing the at least two adjacent second dummy semiconductor fins of the second fin group, wherein recessing the at least two adjacent first dummy semiconductor fins of the first fin group and recessing the at least two adjacent second dummy semiconductor fins of the second fin group are performed separately, the at least two adjacent first dummy semiconductor fins of the first fin group having concave topmost surfaces after recessing the at least two adjacent first dummy semiconductor fins of the first fin group, and the at least two adjacent second dummy semiconductor fins of the second fin group having convex topmost surfaces after recessing the at least two adjacent second dummy semiconductor fins of the second fin group.

8. The method of claim 7, further comprising:
forming an isolation structure to cover the concave topmost surfaces of the at least two adjacent first dummy semiconductor fins and the convex topmost surfaces of the at least two adjacent second dummy semiconductor fins.

9. The method of claim 7, further comprising:
forming at least one active semiconductor fin on the substrate and adjacent to the second fin group, wherein the second fin group is disposed between the active semiconductor fin and the first fin group.

10. The method of claim 7, wherein the at least two adjacent first dummy semiconductor fins of the first fin group are recessed before the at least two adjacent second dummy semiconductor fins of the second fin group are recessed.

11. The method of claim 7, wherein the at least two adjacent first dummy semiconductor fins of the first fin group are recessed after the at least two adjacent second dummy semiconductor fins of the second fin group are recessed.

12. The method of claim 7, further comprising:
forming a third fin group on the substrate and adjacent to the first fin group, the third fin group comprising at least two adjacent third dummy semiconductor fins, the first fin group being disposed between the second fin group and the third fin group; and
recessing the at least two adjacent third dummy semiconductor fins of the third fin group, wherein recessing the at least two adjacent first dummy semiconductor fins of the first fin group, recessing the at least two adjacent second dummy semiconductor fins of the second fin group, and recessing the at least two adjacent third dummy semiconductor fins of the third fin group are performed separately.

13. The method of claim 12, wherein the at least two adjacent first dummy semiconductor fins of the first fin group are recessed before the at least two adjacent third dummy semiconductor fins of the third fin group are recessed.

14. The method of claim 12, wherein the at least two adjacent second dummy semiconductor fins of the second fin group are recessed before the at least two adjacent third dummy semiconductor fins of the third fin group are recessed.

15. The method of claim 12, wherein the at least two adjacent first dummy semiconductor fins of the first fin group are recessed after the at least two adjacent third dummy semiconductor fins of the third fin group are recessed.

16. A method comprising:
performing a first etching process on a substrate to form a plurality of dummy semiconductor fins;
performing a second etching process on a first dummy semiconductor fin of the plurality of dummy semiconductor fins, the first dummy semiconductor fin having a concave topmost surface after completing the second etching process;
performing a third etching process on a second dummy semiconductor fin of the plurality of dummy semiconductor fins, the second dummy semiconductor fin having a convex topmost surface after completing the third etching process; and
forming an isolation structure over the plurality of dummy semiconductor fins, a topmost surface of the isolation structure being above the concave topmost surface of the first dummy semiconductor fin and the convex topmost surface of the second dummy semiconductor fin.

17. The method of claim 16, wherein the third etching process is performed after the second etching process.

18. The method of claim 16, wherein the third etching process is performed before the second etching process.

19. The method of claim 16, further comprising:
performing a fourth etching process on a third dummy semiconductor fin of the plurality of dummy semiconductor fins, the third dummy semiconductor fin having a convex topmost surface after completing the fourth etching process.

20. The method of claim 19, wherein the second etching process, the third etching process and the fourth etching process are performed separately.

\* \* \* \* \*